(12) United States Patent
Ontalus

(10) Patent No.: US 11,056,533 B1
(45) Date of Patent: Jul. 6, 2021

(54) BIPOLAR JUNCTION TRANSISTOR DEVICE WITH PIEZOELECTRIC MATERIAL POSITIONED ADJACENT THERETO

(71) Applicant: GLOBALFOUNDRIES U.S. Inc., Santa Clara, CA (US)

(72) Inventor: Viorel Ontalus, Unionville, CT (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/804,952

(22) Filed: Feb. 28, 2020

(51) Int. Cl.
  *H01L 27/20* (2006.01)
  *H01L 27/082* (2006.01)
  *H01L 29/73* (2006.01)

(52) U.S. Cl.
  CPC .......... *H01L 27/20* (2013.01); *H01L 27/0823* (2013.01); *H01L 29/73* (2013.01)

(58) Field of Classification Search
  None
  See application file for complete search history.

(56) References Cited

U.S. PATENT DOCUMENTS

| 3,792,321 | A | 2/1974 | Seifert | |
|---|---|---|---|---|
| 7,262,484 | B2 * | 8/2007 | Dunn | H01L 29/66242 257/565 |
| 7,329,941 | B2 * | 2/2008 | Chidambarrao | H01L 29/0804 257/586 |
| 7,696,673 | B1 | 4/2010 | Yavid | |
| 7,859,171 | B2 | 12/2010 | Micallef | |
| 9,044,625 | B2 | 6/2015 | Palacharla et al. | |
| 9,608,096 | B1 * | 3/2017 | Camillo-Castillo | H01L 29/0821 |
| 9,825,157 | B1 | 11/2017 | Jain et al. | |
| 2018/0040731 | A1 * | 2/2018 | Flachowsky | H01L 29/4908 |
| 2018/0226347 | A1 | 8/2018 | Stamper et al. | |

FOREIGN PATENT DOCUMENTS

| WO | 2005/083882 A1 | 9/2005 |
|---|---|---|
| WO | 2013/017131 A2 | 2/2013 |

OTHER PUBLICATIONS

Al-Sa'di et al., "Modeling of a Novel NPN-SiGe-HBT Device Structure Using Strain Engineering Technology in the Collector Region for Enhanced Electrical Performance," 978-1-4244-8579-6/10, 2010 IEEE, pp. 216-219.

Canderle et al., "Impact of BEOL Stress on BiCMOS9MW HBTs," IEEE BCTM 13.1, 978-1-4799-0129-6/13, 2013 IEEE, pp. 223-226.

Dinh et al., "Improving the high-frequency performance of SiGe HBTs by a global additional uniaxial stress," Solid-State Electronics, 60:58-64, 2011.

* cited by examiner

*Primary Examiner* — Benjamin P Sandvik
(74) *Attorney, Agent, or Firm* — Hoffman Warnick LLC

(57) ABSTRACT

One illustrative device disclosed herein includes a semiconductor substrate, a bipolar junction transistor (BJT) device that comprises a collector, a base and an emitter, at least one piezoelectric structure comprising a piezoelectric material positioned adjacent the BJT device, and at least first and second conductive contact structures that are conductively coupled to the piezoelectric structure.

20 Claims, 14 Drawing Sheets

BIPOLAR JUNCTION TRANSISTOR DEVICE WITH PIEZOELECTRIC MATERIAL POSITIONED ADJACENT THERETO

BACKGROUND

Field of the Disclosure

Generally, the present disclosure relates to various novel embodiments of a bipolar junction transistor (BJT) device with piezoelectric material positioned adjacent the BJT device and various novel methods of making such a BJT device.

Description of the Related Art

Bipolar junction transistor (BJT) devices are widely used in many integrated circuit products. In general, a BJT device comprises a collector, a base and an emitter. Current flows from the emitter to the base and exits the BJT device via the collector. The BJT device may be either an NPN device or a PNP device. Device designers are under constant pressure to increase the operating speed and electrical performance of BJT devices and integrated circuit products that employ such BJT devices.

The present disclosure is directed to various novel embodiments of a bipolar junction transistor (BJT) device with piezoelectric material positioned adjacent the BJT device and various novel methods of making such a BJT device.

SUMMARY

The following presents a simplified summary of at least one disclosed embodiment in order to provide a basic understanding of some aspects of the subject matter disclosed herein. This summary is not an exhaustive overview of all of the subject matter disclosed herein. It is not intended to identify key or critical elements of the subject matter disclosed herein or to delineate the scope of any claims directed to any of the subject matter disclosed herein. Its sole purpose is to present some concepts in a simplified form as a prelude to the more detailed description that is discussed later in the application.

The present disclosure is generally directed to various novel embodiments of a bipolar junction transistor (BJT) device with piezoelectric material positioned adjacent the BJT device and various novel methods of making such a BJT device. One illustrative device disclosed herein includes a semiconductor substrate, a bipolar junction transistor (BJT) device that comprises a collector, a base and an emitter, at least one piezoelectric structure comprising a piezoelectric material positioned adjacent the BJT device, and at least first and second conductive contact structures that are conductively coupled to the piezoelectric structure.

BRIEF DESCRIPTION OF THE DRAWINGS

The disclosure may be understood by reference to the following description taken in conjunction with the accompanying drawings, in which like reference numerals identify like elements, and in which.

Figure 1:
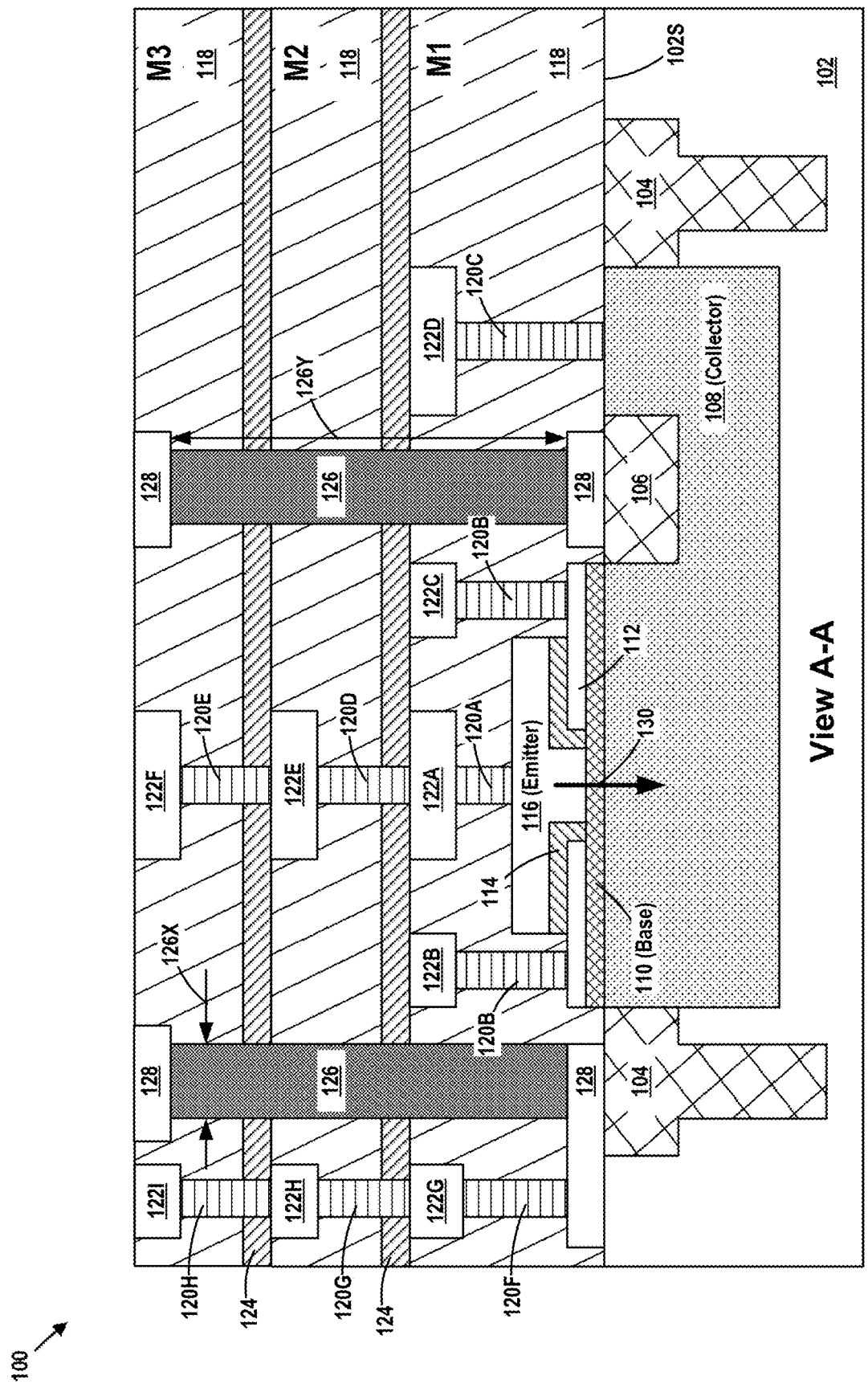
FIGS. 1-14 depict various novel embodiments of a bipolar junction transistor (BJT) device with piezoelectric material positioned adjacent the BJT device and various novel methods of making such a BJT device. The drawings are not to scale.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the presently disclosed method may be applicable to a variety of products, including, but not limited to, logic products, memory products, etc. With reference to the attached figures, various illustrative embodiments of the methods and devices disclosed herein will now be described in more detail. The various components, structures and layers of material depicted herein may be formed using a variety of different materials and by performing a variety of known process operations, e.g., chemical vapor deposition (CVD), atomic layer deposition (ALD), a thermal growth process, spin-coating techniques, masking, etching, etc. The thicknesses of these various layers of material may also vary depending upon the particular application.

FIGS. 1-14 depict various novel embodiments of a bipolar junction transistor (BJT) device 100 with piezoelectric material positioned adjacent the BJT device 100 and various novel methods of making such a BJT device 100. As will be appreciated by those skilled in the art after a complete reading of the present application, the subject matter disclosed herein may be employed with any type or form of a bipolar transistor device, e.g., a vertical BJT device, a lateral BJT device, etc., where the electric mobility of the minority carriers in the base region (e.g., the holes in a PNP device that pass through the base region) can be enhanced by the application of a mechanical stress (tensile or compressive). Thus, the presently disclosed subject matter should not be considered to be limited to the form or structure of the illustrative BJT device 100 disclosed herein. Additionally, the BJT device 100 may be either an NPN device or a PNP device.

Figure 2:
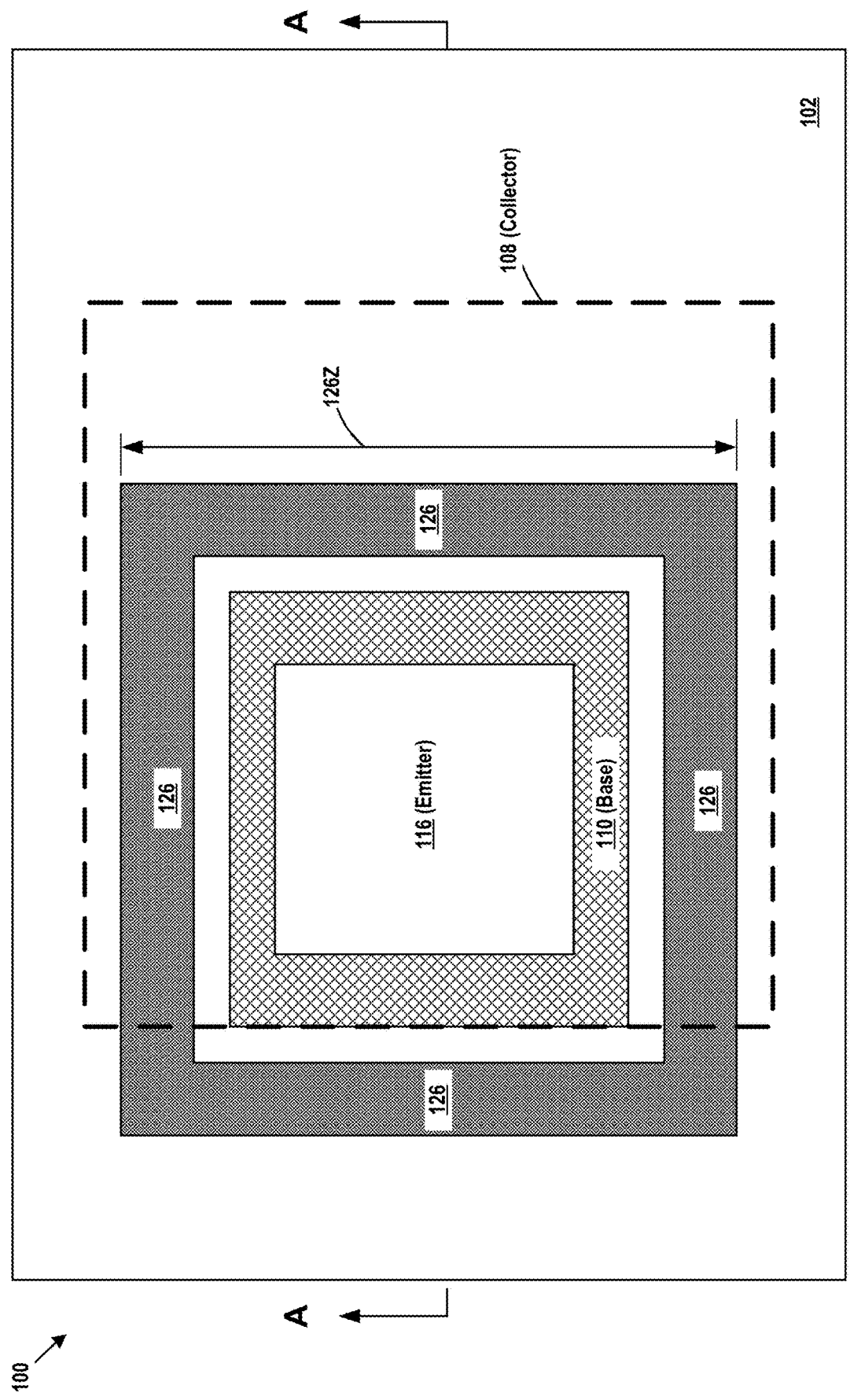

FIG. 1 is a cross-sectional view (A-A) of the BJT device 100. FIG. 2 is a plan view of one illustrative embodiment of a BJT device 100 disclosed herein. The location where the cross-sectional view (A-A) is taken is also depicted in the plan views. The plan views herein omit some of the structures and layers of material shown in the cross-sectional views so as to facilitate explanation of the subject matter disclosed herein.

In the depicted examples, and with reference to FIG. 2, the BJT device 100 will be formed above a semiconductor substrate 102. The substrate 102 may have a variety of configurations, such as a bulk semiconductor substrate depicted herein, or it may take the form of a semiconductor-on-insulator (SOI) substrate. Such an SOI substrate includes a base semiconductor layer, a buried insulation layer positioned on the base semiconductor layer and an active semiconductor layer positioned above the buried insulation layer. In some applications, the substrate 102 may be made of silicon or it may be made of semiconductor materials other than silicon. Thus, the terms "substrate" or "semiconductor substrate" should be understood to cover all semiconductor materials and all forms of such materials.

With reference to FIG. 1, a deep isolation structure 104 and a shallow isolation structure 106 were initially formed in the substrate 102 by performing known manufacturing techniques. The deep isolation structure 104 and the shallow isolation structure 106 may be comprised of any insulating material, e.g., silicon dioxide. Also depicted in FIG. 1 is the collector 108, the base 110 and the emitter 116 of the illustrative BJT device 100. A conductive material layer 112 is positioned on the base 110. The conductive material layer 112 may be comprised of any conductive material, e.g., a metal silicide, a layer of tungsten, a highly doped semiconductor material with metal silicide on top of the semiconductor material, etc. A layer of insulating material 114, e.g., silicon dioxide, is positioned between the emitter 116 and the layer of conductive material 112. As depicted, a portion of the emitter 116 contacts a portion of the base 110. In the depicted example, the collector 108 is a doped region that is formed in the substrate 102. The dopant concentration of the collector 108 may vary depending upon the particular application. In some applications, at least part of the collector 108 may also be formed in a region of doped epitaxial semiconductor material (not shown) that is grown on the substrate 102. In one illustrative example, the base 110 may comprise a doped layer of silicon germanium and the emitter 116 may comprise a doped layer of silicon, or other doped semiconductor materials or compound semiconductor materials. The collector 108, the base 110, the layer of conductive material 112 and the layer of insulating material 114 may all be manufactured by performing known processing techniques. As noted above, the present subject matter may be applied to a bipolar junction transistor of any shape or form. For example, in the depicted BJT device 100, the base 110 and the emitter 116 are formed above the upper surface of the substrate 102. However, in other embodiments, e.g., lateral BJT devices, the base and the emitter of the bipolar junction transistor may be simply doped regions that are formed in the substrate 102 wherein the base region is positioned within the collector region and the emitter region is positioned within the base region.

Also depicted in FIG. 1 are representative layers of insulating material 118 (e.g., silicon dioxide, a low-k material, etc.) and representative etch stop layers 124 (e.g., silicon nitride). The thickness of such layers of material 118, 124 and the manner in which they are made are well known to those skilled in the art. There is no requirement that all of the layers of insulating material 118 be made of the same insulating material, but that may be the case in some applications. Similarly, there is no requirement that all of the etch stop layers 124 be made of the same material, but that may be the case in some applications.

Various conductive contacts (generally referenced using the numeral 120) and various conductive lines (generally referenced using the numeral 122) are depicted in FIG. 1. In this particular example, three metallization layers (M1, M2 and M3) are shown. The conductive contacts 120 and the conductive lines 122 may be formed by performing known manufacturing techniques and they may be formed from any desired conductive material, e.g., tungsten, copper, aluminum, etc. Moreover, the conductive contacts 120 and the conductive lines 122 need not be formed of the same material, but that may be the case in some applications.

As shown in FIG. 1, within the M1 metallization layer, an illustrative and representative conductive contact 120A and a conductive line 122A are conductively coupled to the emitter 116, a plurality of representative conductive contacts 120B and conductive lines 122B, 122C are conductively coupled to the layer of conductive material 112 (and thus conductively coupled to the base 110) and an illustrative and representative conductive contact 120C and conductive line 122D are conductively coupled to the collector 108. Of course, any desired number of conductive contacts may be formed to contact any of the structures of the BJT device 100 discussed above. In the M2 metallization layer, a conductive contact 120D and a conductive line 122E are conductively coupled to the conductive line 122A. In the M3 metallization layer, a conductive contact 120E and a conductive line 122F are conductively coupled to the conductive line 122E.

Also depicted in FIG. 1 is structure 126 comprised of a piezoelectric material (hereinafter a "PM structure 126") with a plurality of conductive contact structures 128 that are conductively coupled to the PM structure 126. The PM structure 126 may have any desired lateral width 126X, any desired vertical height 126Y and any desired length 126Z (see FIG. 2). In one illustrative example, the PM structure 126 may have a lateral width 126X that falls within the range of about 2 nm-1 μm, a vertical height 126Y that falls within the range of about 50 nm-5 μm and a length 126Z that falls within the range of about 2 nm-1 μm. The conductive contact structures 128 are positioned on the PM structure 126 so as to allow a voltage (positive or negative) to be applied to the PM structure 126, as will be described more fully below. The conductive contact structures 128 may be in any form or shape, they may be comprised of any conductive material, and they may contact any portion or surface of the PM structure 126. In the example shown in FIG. 1, the bottom conductive contact structure 128 that is positioned between the PM structure 126 and deep isolation structure 104 comprises an extended portion that allows the bottom conductive contact structure 128 to be conductively contacted by the combination of the plurality of conductive contacts 120F-H and the plurality of conductive lines 122G-I. Of course, the bottom conductive contact structure 128 may be contacted using conductive structures with a different routing than that depicted herein. The conductive structures positioned above the M3 metallization layer that contact the upper conductive contact structure 128 are not shown in the drawings.

The PM structure 126 may be comprised of any desired piezoelectric material, e.g., AlN, $Al_{0.88}Sc_{0.22}N$, $(Mg_{0.5}Zr_{0.5})_{0.13}Al_{0.87}N$, $(Mg_{0.5}Kf_{0.5})_{0.13}Al_{0.87}N$, BST, GaN, $(K_{0.5}Na_{0.5})_{0.13}NbO_3$, $LiNbO_3$, $LiTaO_3$, PZT, ZnO, $AlPO_4$ (Berlinite), $GaPO_4$ (gallium orthophosphate), $La_3Ga_5SiO_{14}$ (langasite), DIPAB (diisopropylammonium bromide), $BaTiO_3$, $PbTiO_3$, $Pb(ZrTi)O_3$, $KNbO_3$, $LiNbO_3$, $Na_2WO_3$, $Ba_2NaNb_5O_5$, $Pb_2Knb_5O_{15}$, $(K, Na)NbO_3$, $BiFeO_3$, $Bi_4Ti_3O_{12}$, $Na_{0.5}Bi_{0.5}TiO_3$, polyvinylidene fluoride (PVDF), self-assembled diphenylalanine peptide nanotubes (PNTs), etc. To the extent that there are multiple PM structures 126 positioned adjacent the BJT device 100, each of the PM structures 126 need not be made of the same piezoelectric material, but that may be the case in some application.

When viewed from above, the BJT device 100 has an outer perimeter or footprint. As will be appreciated by those skilled in the art after a complete reading of the present application, piezoelectric material will be positioned adjacent to the BJT device 100 and positioned around at least a portion of the outer perimeter of one of the components, e.g., the base of the BJT device 100. In the examples shown in FIGS. 1-4, the piezoelectric material is positioned above the upper surface 102S of the substrate 102.

Figure 3:
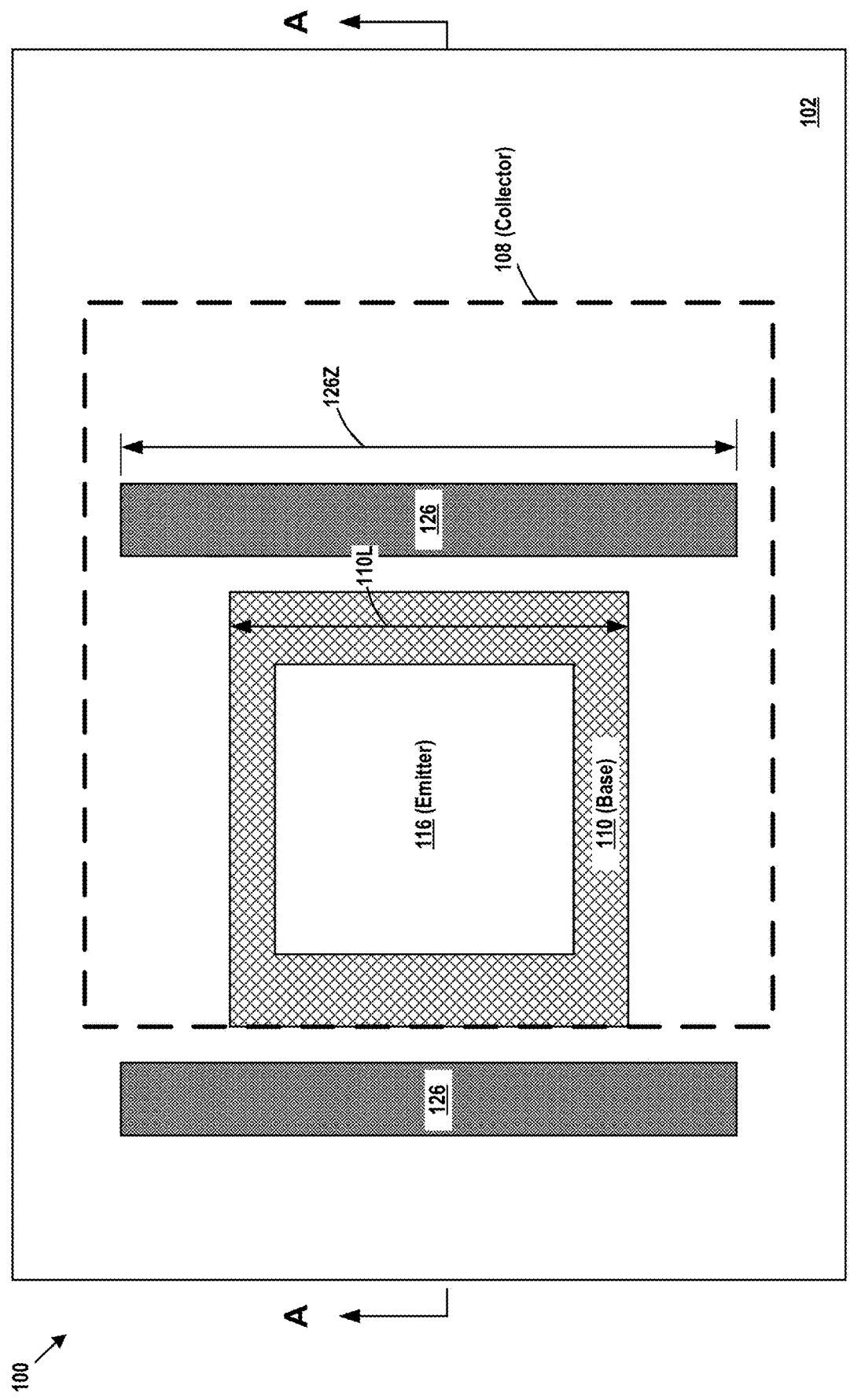
Figure 4:
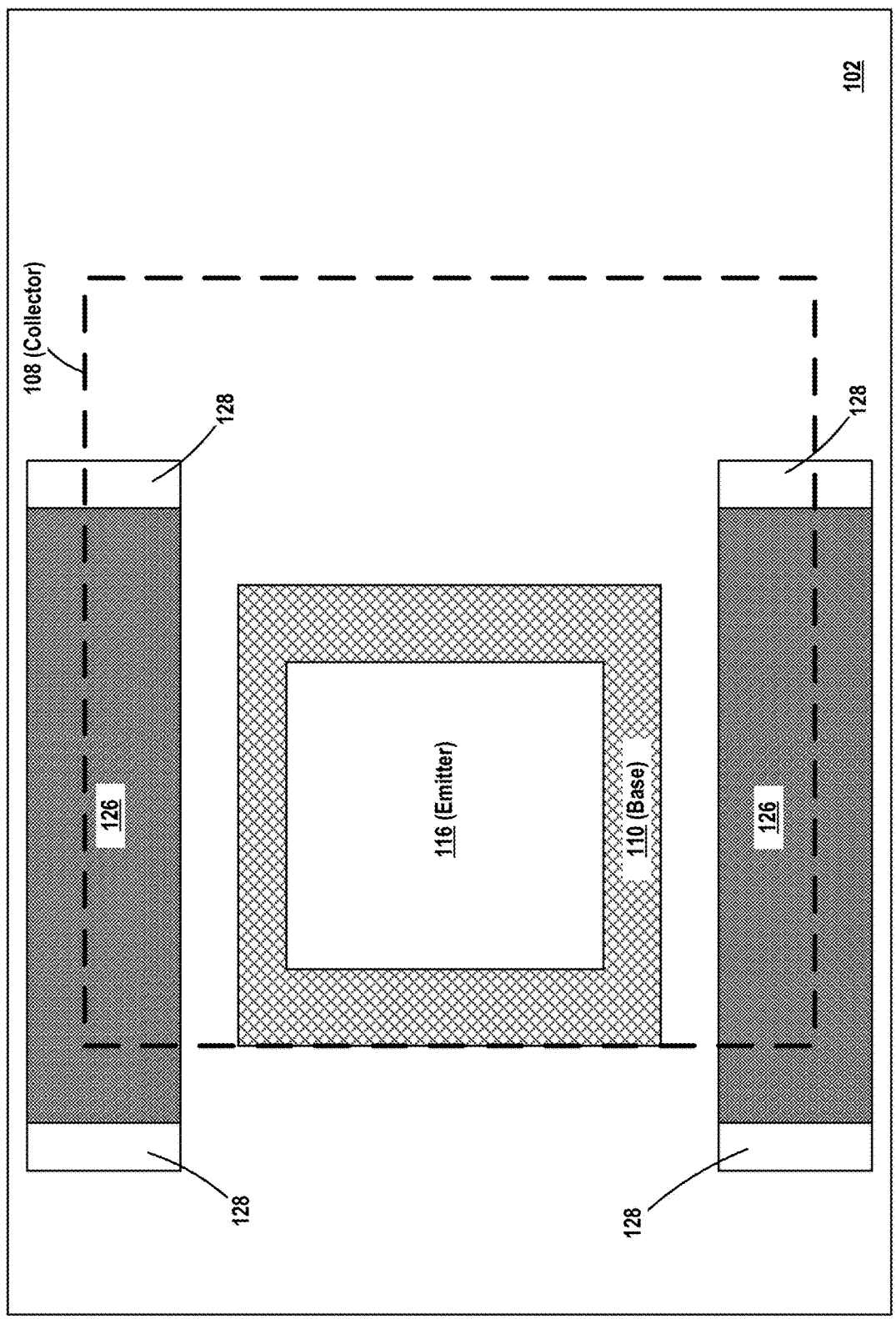

FIGS. 2-7 are plan views that depict illustrative embodiments of the BJT device 100 wherein many of the layers of material and structures shown in FIG. 1 have been omitted so as to facilitate explanation of the subject matter disclosed herein. FIGS. 2-7 depict plan views of the PM structure 126 at some location within the M2 metallization layer. More specifically, in FIGS. 2-7, only the substrate 102, the collector 108 (depicted by dashed lines), the base 110, the emitter 116 and the PM structure 126 are shown. In FIG. 4, the conductive contact structures 128 are also shown. Note that the plan view in FIGS. 4 and 6 does not agree with the cross-sectional view shown in FIG. 1.

FIG. 2 depicts an illustrative embodiment of the BJT device 100 wherein the PM structure 126 is a continuous ring-like structure having an opening therein that is positioned around the entire outer perimeter of the base 110. Of course, if desired, the PM structure 126 shown in FIG. 2 could be made larger such that it is positioned above the substrate 102 and around the entire perimeter of the collector 108 (and around the entire outer perimeter of the base 110). However, typically, the closer the PM structure 126 is positioned to the base region 110, the better will be the mechanical coupling between the PM structure 126 and the base 110, thereby making the applied mechanical stress more effective. Note that the conductive contact structures 128 shown in FIG. 1 are not depicted in FIG. 2 since the cross-sectional view of the PM structure 126 in FIG. 2 is at a location within the M2 metallization layer. In this example, when viewed from above, the continuous PM structure 126 has a generally rectangular shaped ring-like structure. Other configurations of the continuous ring-like PM structure 126 are, of course, possible, e.g., oval, square, etc.

FIG. 3 depicts an illustrative embodiment of the BJT device 100 wherein two separate PM structures 126 are positioned on opposite sides of the BJT device 100 and adjacent at least a portion of the outer perimeter of the base 110. In the depicted example, the PM structures 126 have an axial length 126Z that is greater than the axial length 110L of the base 110, but that may not be the case in all applications. In this example, when viewed from above, each of the PM structures 126 has a substantially rectangular configuration. Of course, as will be appreciated by those skilled in the art after complete reading of the present application, other possible configurations of the PM structure(s) 126 are possible, e.g., non-rectangular, oval, etc. Moreover, the two PM structures 126 need not have the same configuration and they may not have the same physical dimension (e.g., length, width and height), but that may be the case in some applications.

FIG. 4 depicts yet another illustrative embodiment of the BJT device 100 wherein two separate PM structures 126 are positioned on opposite sides of the BJT device 100 and adjacent at least a portion of the outer perimeter of the base 110. In this example, when viewed from above, each of the PM structures 126 also has a substantially rectangular configuration. Also depicted in FIG. 4 are illustrative conductive contact structures 128 that contact the vertical end sidewalls of the PM structures 126.

Figure 5:
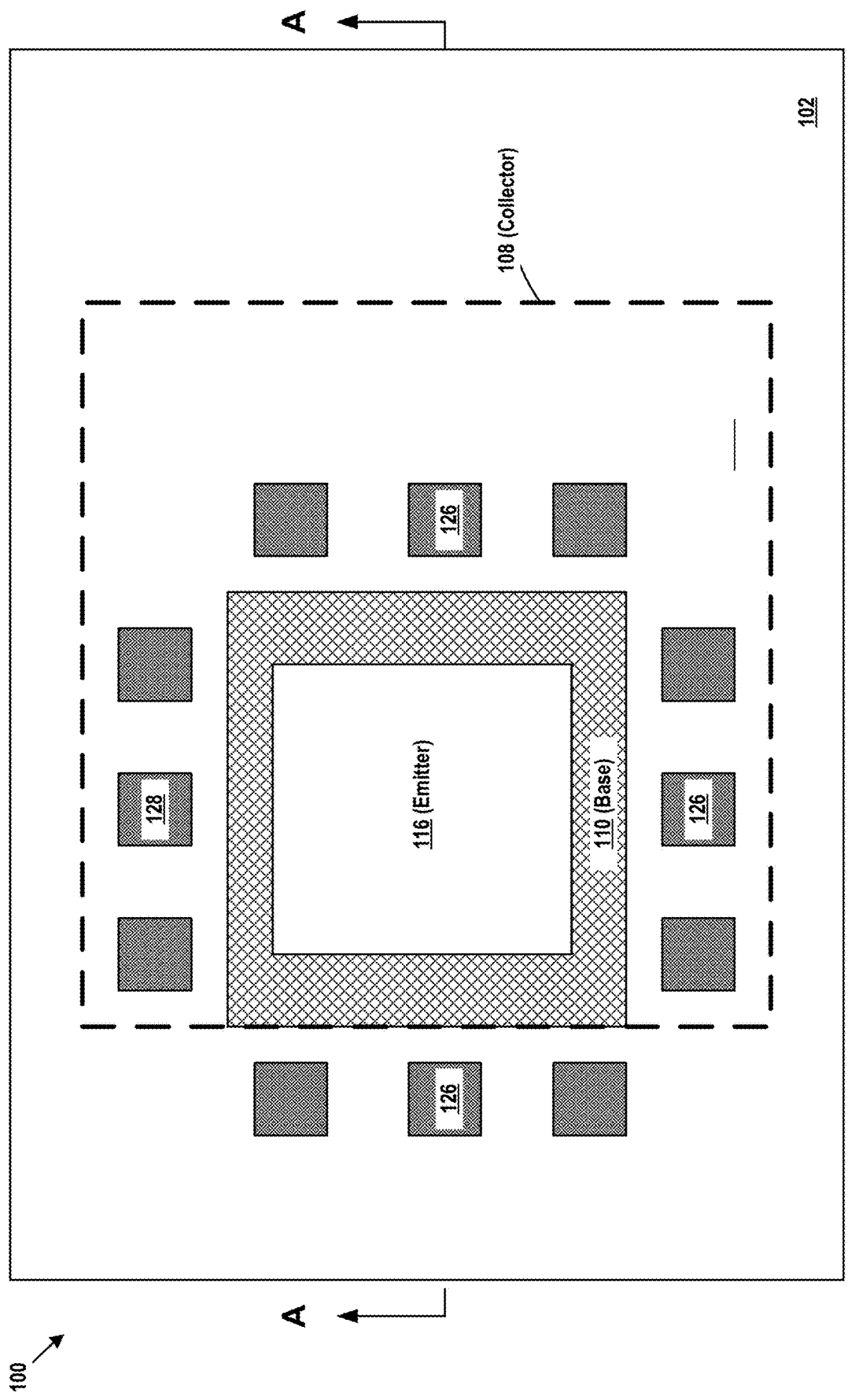

FIG. 5 depicts yet another illustrative embodiment of the BJT device 100 wherein nine individual PM structures 126 are positioned around the perimeter of the base 110. In this example, when viewed from above, each of the PM structures 126 has a substantially square configuration. Of course, other configurations for the individual PM structures 126 are also possible, e.g., substantially circular.

Figure 6:
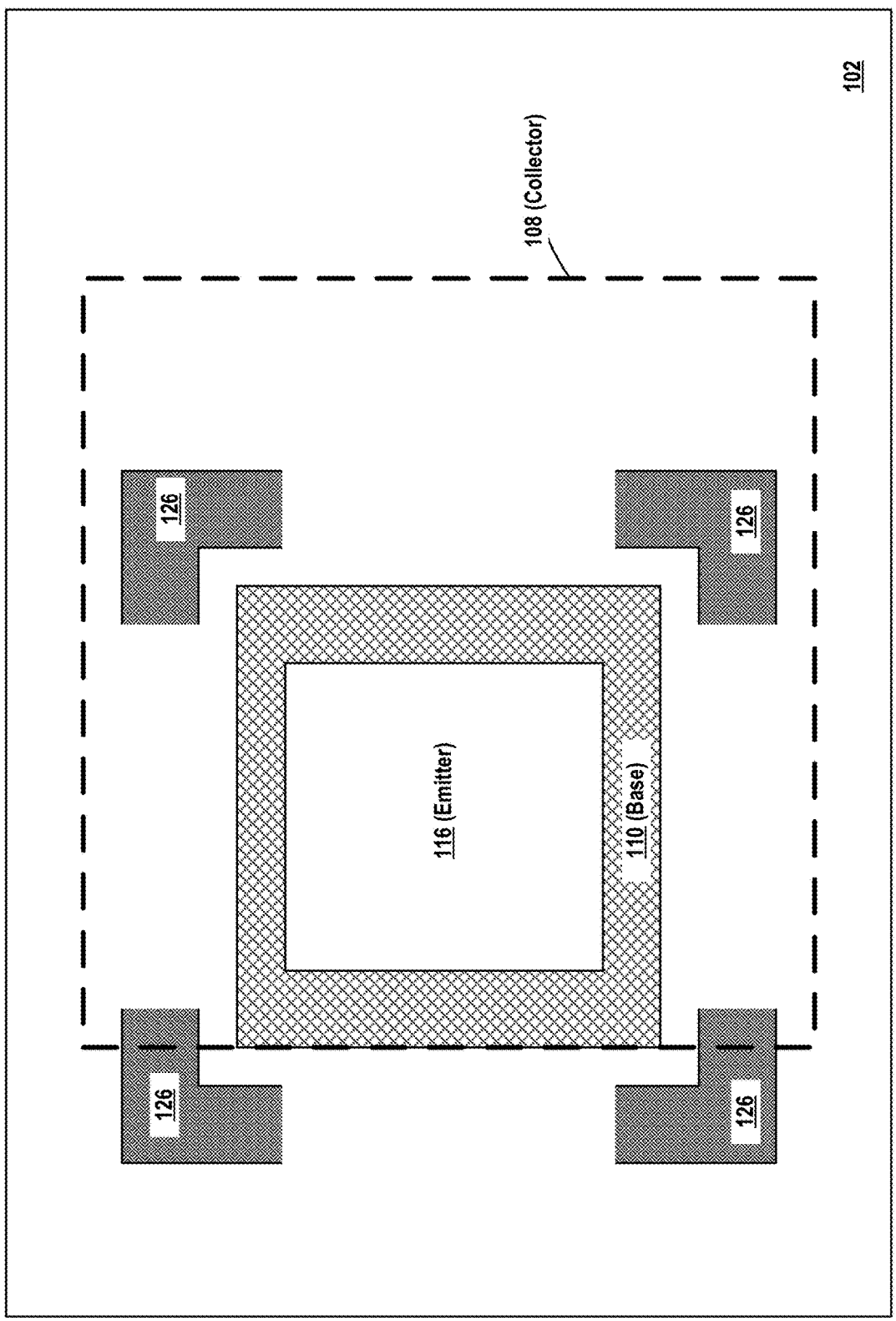

FIG. 6 depicts yet another illustrative embodiment of the BJT device 100 wherein four individual PM structures 126 are positioned adjacent the corner regions of the base 110. In this example, when viewed from above, each of the PM structures 126 has a non-rectangular configuration.

Figure 7:
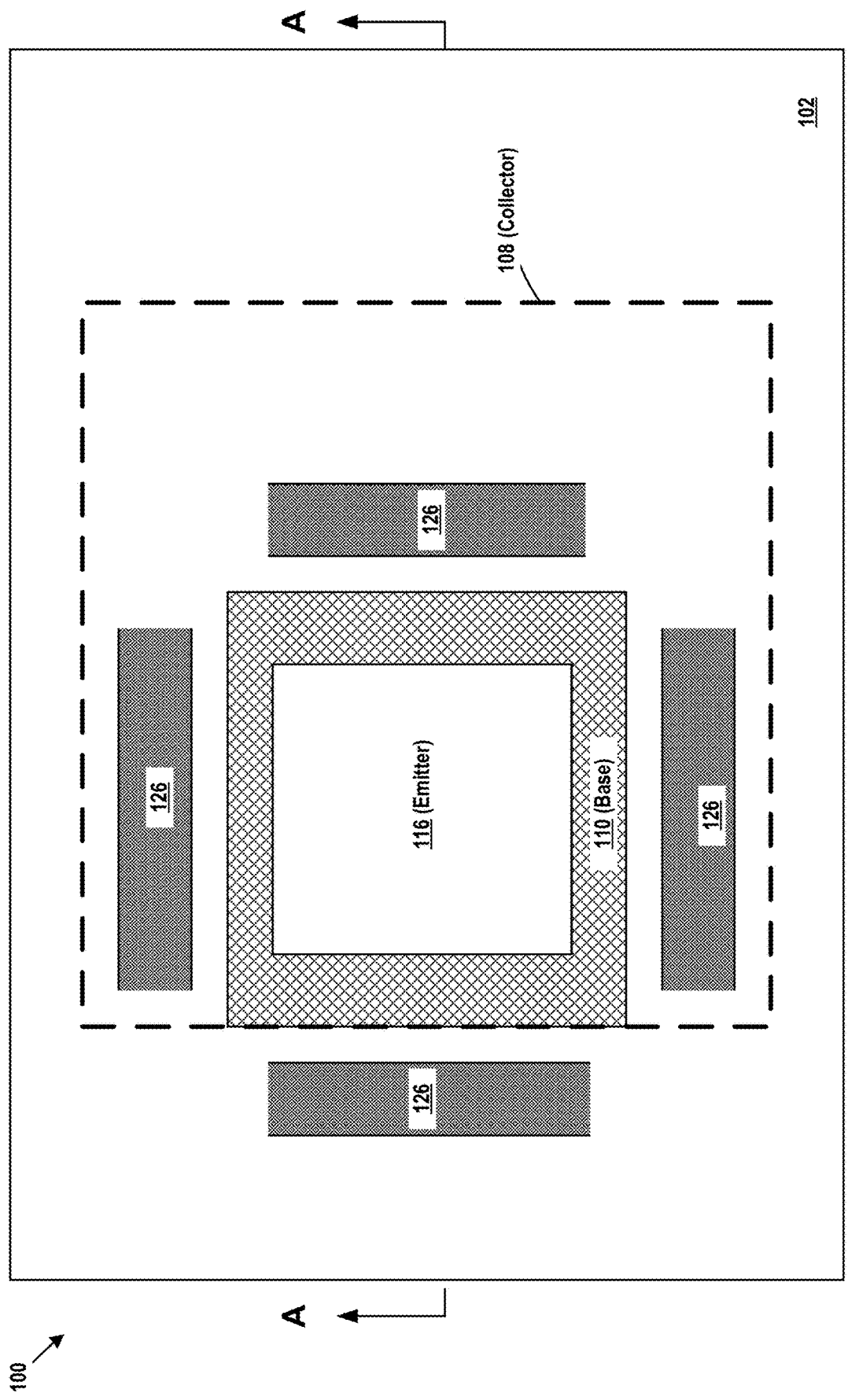

FIG. 7 depicts yet another illustrative embodiment of the BJT device 100 wherein four separate PM structures 126 are positioned around the perimeter of the base 110. In this example, when viewed from above, each of the PM structures 126 also have a substantially rectangular configuration.

Figure 8:
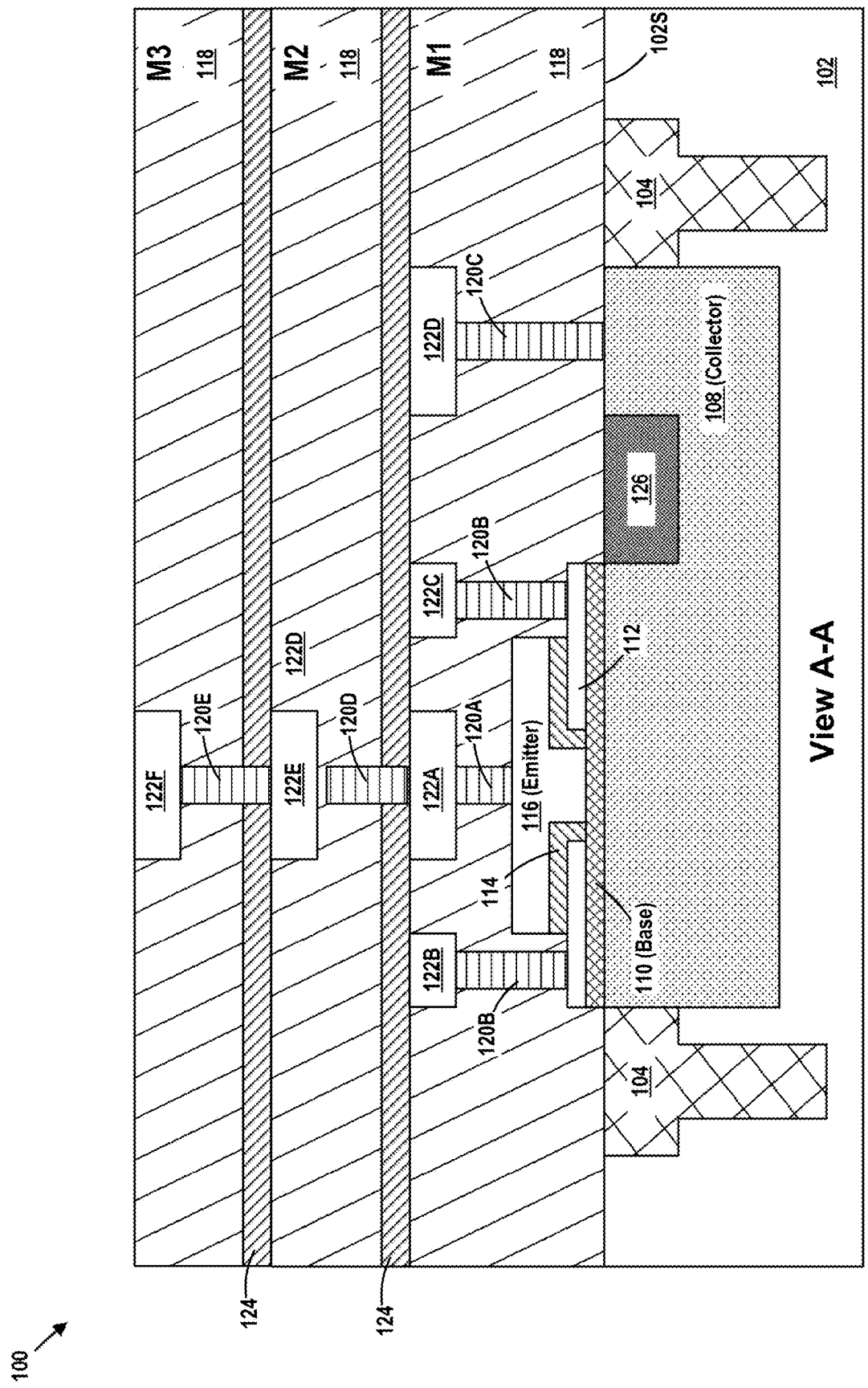
Figure 9:
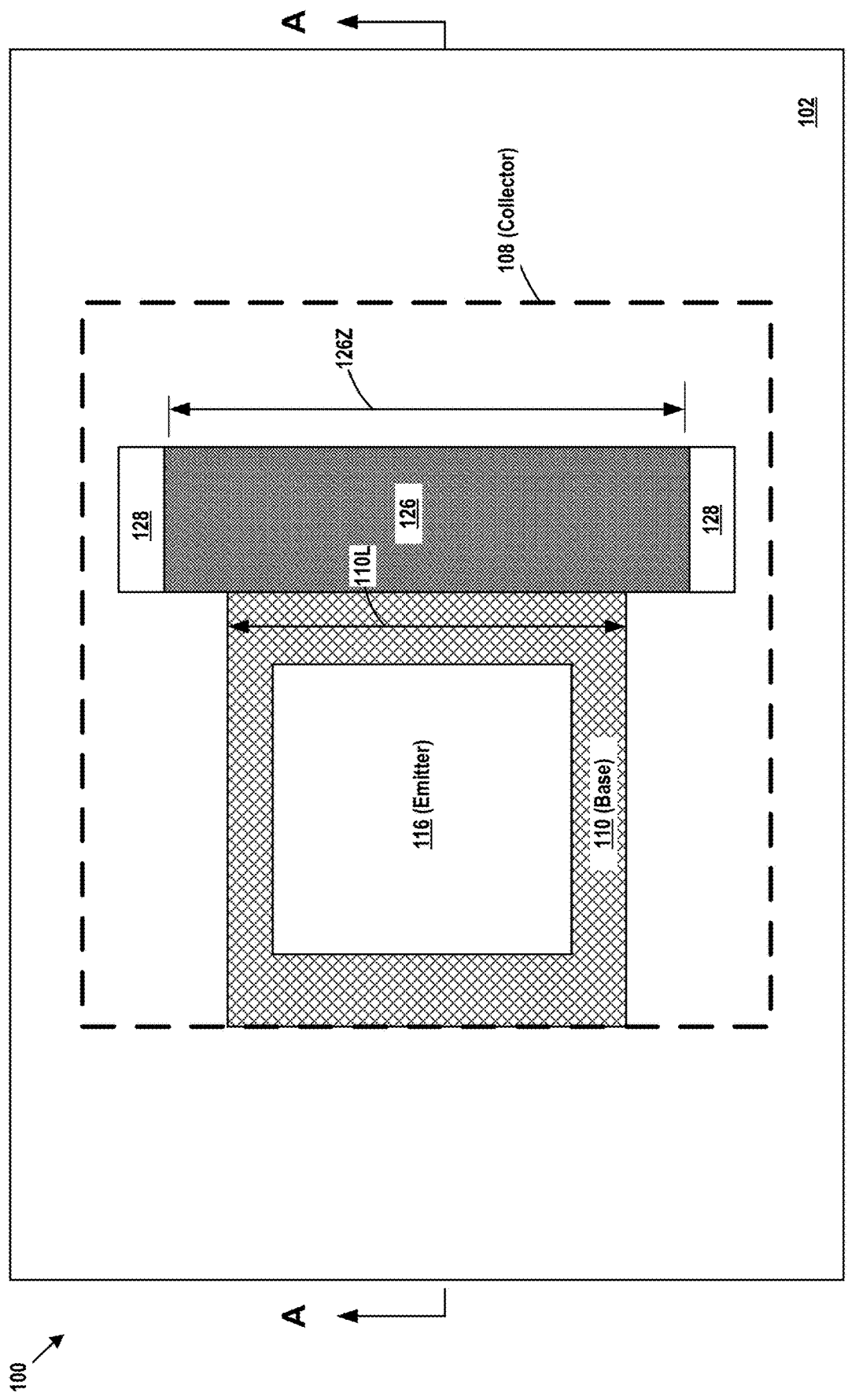
Figure 10:
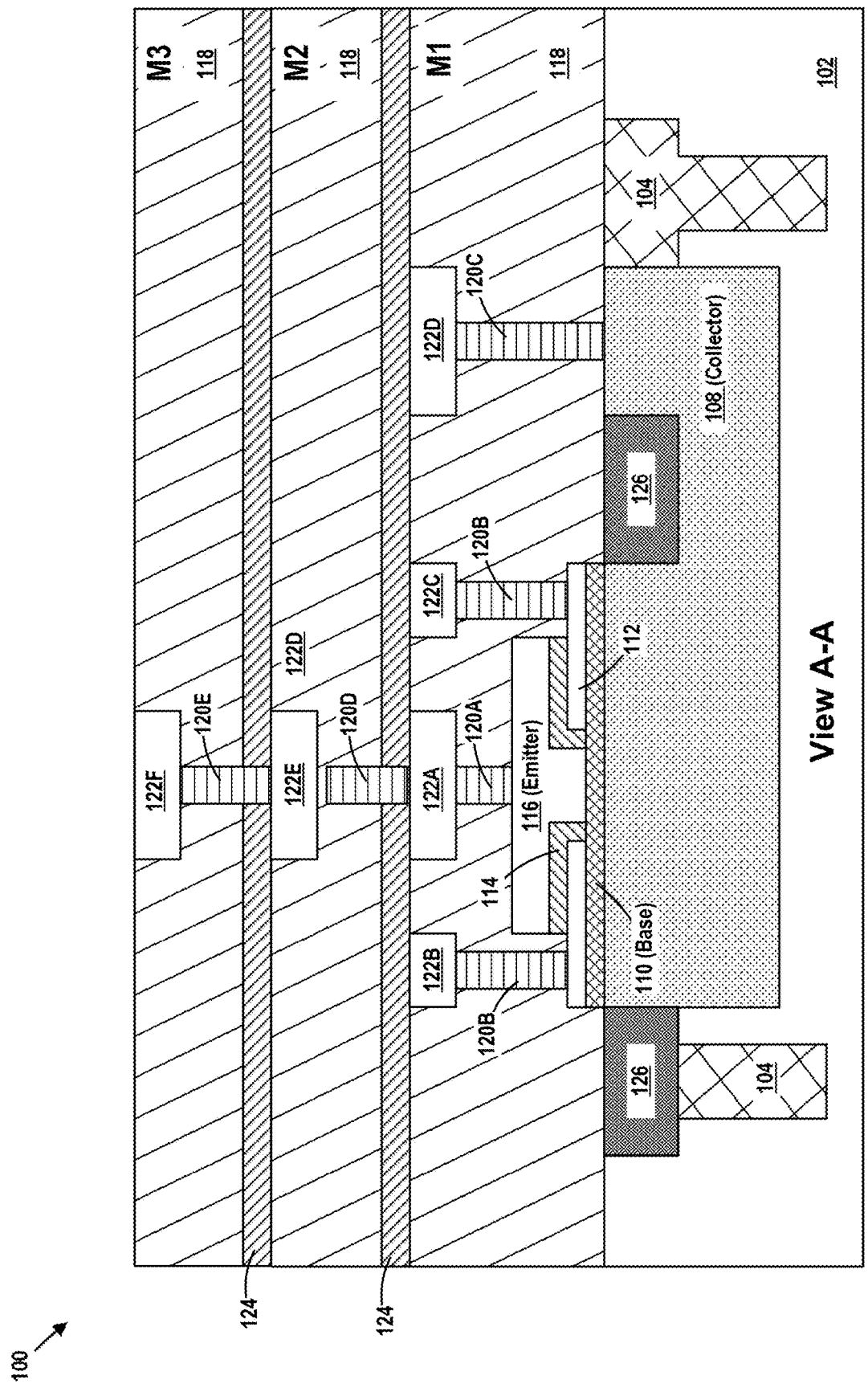
Figure 11:
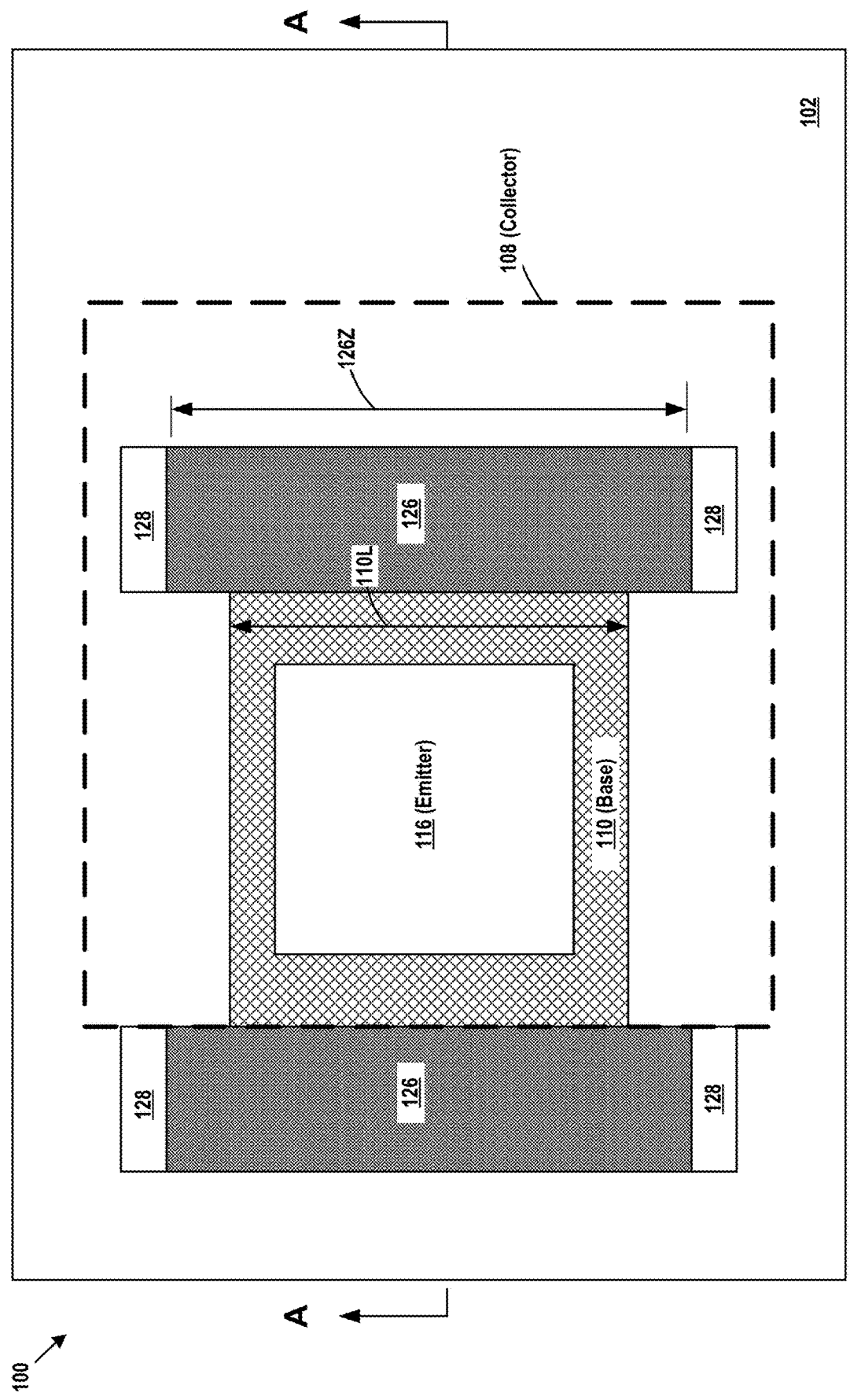
Figure 12:
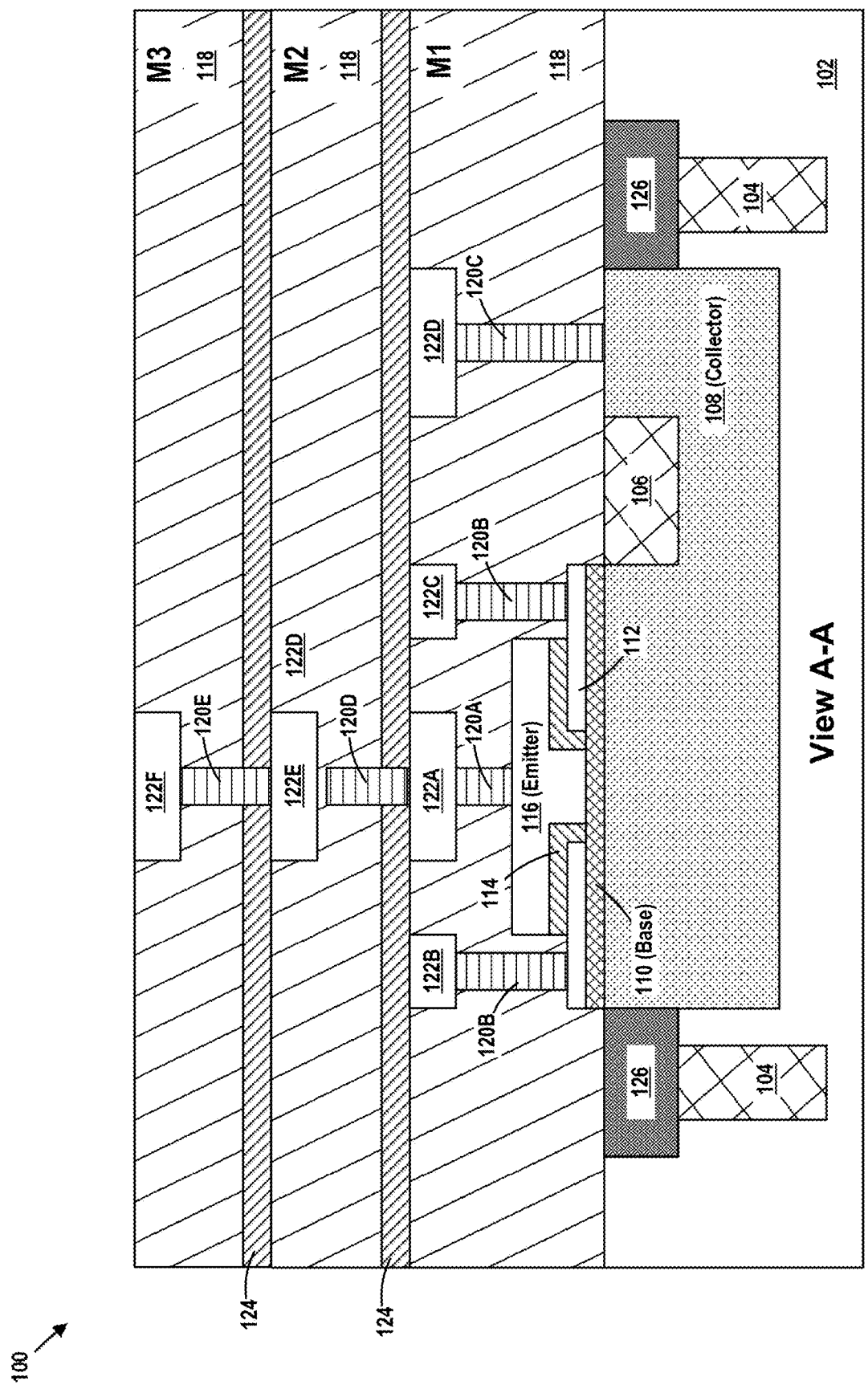
Figure 13:
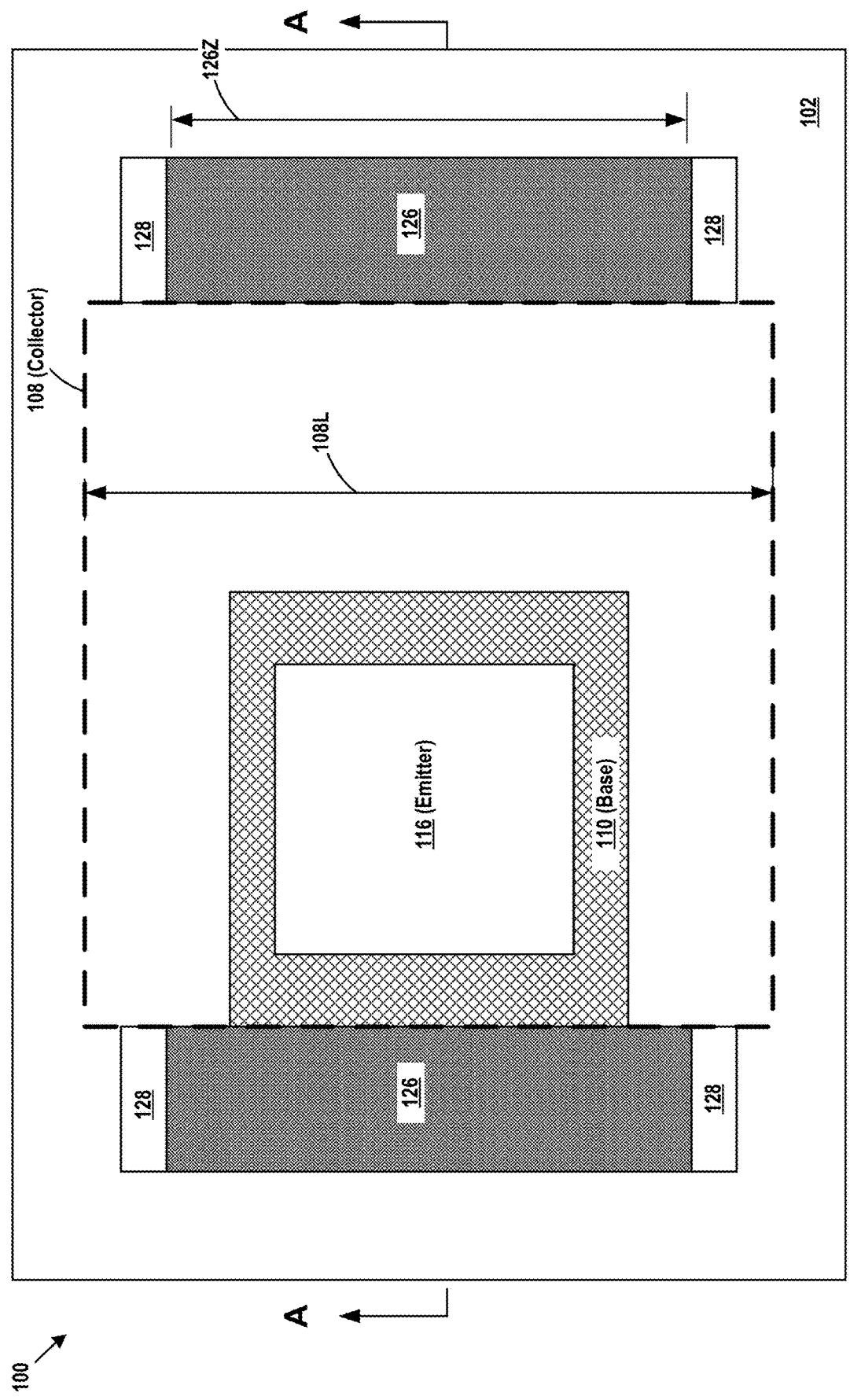

FIGS. 8-13 depict illustrative embodiments of the BJT device 100 wherein one or more PM structures 126 are positioned in the substrate 102. In one embodiment, the upper surface of the PM structures 126 may be substantially co-planar with the upper surface 102S of the substrate 102. Of course, as will be appreciated by those skilled in the art after a complete reading of the present application, the BJT devices 100 disclosed herein may have one or more PM structures 126 positioned in the substrate 102 and one or more PM structures 126 positioned above the substrate 102, like the examples shown in FIGS. 1-7. In yet other cases, the PM structures 126 may be formed in such a manner that a first portion of the PM structure 126 extends into the substrate 102 while a second portion of the PM structure 126 extends above an upper surface of the substrate 102. FIGS. 9, 11 and 13 are plan views that depict illustrative embodiments of the BJT device 100 wherein many of the layers of material and structures shown in the cross-sectional views in FIGS. 8, 10 and 12, respectively, have been omitted so as to facilitate explanation of the subject matter disclosed herein.

FIG. 8 (cross-sectional view) and FIG. 9 (plan view) depict an illustrative embodiment of the BJT device 100 wherein a single PM structure 126 is positioned in the substrate 102 at a location between the collector 108 and the base 110 In the depicted example, the PM structure 126 has an axial length 126Z that is greater than the axial length 110L of the base 110, but that may not be the case in all applications. As shown in FIG. 9, illustrative conductive contact structures 128 contact the vertical end sidewalls of the PM structure 126. In this example, when viewed from above, the PM structure 126 has a substantially rectangular configuration. Of course, the PM structure 126 may have other configurations.

FIG. 10 (cross-sectional view) and FIG. 11 (plan view) depict an illustrative embodiment of the BJT device 100 that contains two PM structures 126 that are positioned adjacent opposite sides of the base 110. In the depicted example, the PM structures 126 have an axial length 126Z that is greater than the axial length 110L of the base 110, but that may not be the case in all applications. As shown in FIG. 11, illustrative conductive contact structures 128 contact the vertical end sidewalls of the PM structures 126. Note that, in this example, the base 110 is positioned vertically above the space between the two PM structures 126. In the case where the base 110 is simply a doped region in the substrate 102, the base 110 would be positioned in the substrate 102 in the space between two PM structures 126. In this example, when viewed from above, the PM structures 126 have a substantially rectangular configuration. Of course, the PM structures 126 may have other configurations. Moreover, the two PM structures 126 shown in FIGS. 10 and 11 need not have the same configuration and they may not have the same physical dimension (e.g., length, width and height), but that may be the case in some applications.

FIG. 12 (cross-sectional view) and FIG. 13 (plan view) depict an illustrative embodiment of the BJT device 100 that also contains two PM structures 126 that are positioned adjacent opposite sides of the collector 108. In this depicted example, the PM structures 126 have an axial length 126Z that is less than the axial length 108L of the collector 108, but that may not be the case in all applications. As shown in FIG. 13, illustrative conductive contact structures 128 contact the vertical end sidewalls of the PM structures 126. In this example, when viewed from above, the PM structures 126 have a substantially rectangular configuration. Of course, the PM structures 126 may have other configurations. Moreover, the two PM structures 126 shown in FIGS. 12 and 13 need not have the same configuration and they may not have the same physical dimension (e.g., length, width and height), but that may be the case in some applications. Moreover, the PM structures 126 that are at least partially positioned in the substrate 102 may have a continuous ring-like configuration similar to that shown for the PM structure shown in FIG. 2.

As noted above, the PM structures 126 are made of a piezoelectric material. A piezoelectric material is a material that generates electricity (piezoelectricity) in response to an applied mechanical stress. There is also a reverse piezoelectric effect whereby application of an electric field to the piezoelectric material generates a mechanical strain within the piezoelectric material. For example, when lead zirconate titanate (PZT) is subjected to an appropriate electrical field, its static dimension (before application of the electrical field) will change or deform by about 0.1%. As will be appreciated by those skilled in the art after a complete reading of the present application, an appropriate voltage (both in terms of voltage and polarity) will be applied across the PM structure(s) 126 to induce a desired stress in the base region 110 so as to increase the mobility of electrons (for an NPN device) through the base 110 or the mobility of holes (for a PNP device) through the base 110. By generating a favorable stress profile in the base, the base transit time may be reduced, thereby improving the performance of the BJT device 100 by reducing base transit time. For an NPN device, it is desirable to generate a tensile stress in the base 110 in the direction of current flow through the base 110, as that will allow the electrons to pass through the P-doped base 110 more quickly. The opposite is true for a PNP device—it is desirable to a generate a compressive stress in the base 110 in the direction of current flow through the base 110, as that will allow the holes to pass through the N-doped base 110 more quickly. The desired stress (compressive or tensile) of the PM structure(s) 126 can be easily changed by changing the polarity of the voltage applied to the PM structure(s) 126.

The mobility enhancement through the base 110 is due to changes in the band gap of the material of the base region 110 caused by applying a mechanical stress to the base 110 via material coupling with the PM structure(s) 126. In one illustrative example, where the base 110 is comprised of silicon, the bandgap voltage (EG) of the silicon base may be reduced by about 200 meV when a voltage of about 1 volt is applied to a piezoelectric material positioned in the silicon substrate. In one illustrative example, calculations indicate that, when an appropriate voltage is applied to a PM structure 126 positioned in a silicon substrate, the PM structure 126 may induce a stress in the substrate of about 2Gpa which results in an increase in the magnitude of the collector current by more than 100 times. The magnitude of the voltage applied to the PM structures 126 may vary depending upon the particular application, e.g., 1-10 volts.

With reference to FIG. 1, the flow of current through the BJT device 100 is vertical, as indicated by the arrow 130. Thus, for a vertical NPN device, it would be desirable to induce a vertical tensile stress or a horizontal compressive stress on the device to increase electron mobility. In contrast, if the BJT device 100 is a PNP device, it would be desirable to induce a vertical compressive stress or a horizontal tensile stress on the device to increase hole mobility.

In the cases above where the PM structure(s) 126 are positioned above the upper surface 102S of the substrate 102 (see FIGS. 1-7), the type of stress generated in the PM structure 126 (by virtue of the reverse piezoelectric effect), e.g., a tensile stress, will also be generated within the BJT device 100. That is, if the PM structure 126 elongates vertically when subjected to the appropriate voltage, adjacent components of the BJT device 100 will also elongate in the vertical direction, i.e., there is a tensile stress in the vertical direction in both the PM structure 126 and the BJT device 100, a situation that leads to increased electron mobility through the base 110, which is beneficial for an NPN device. Conversely, if the PM structure 126 contracts vertically when subjected to the appropriate voltage, adjacent components of the BJT device 100 will also contract in the vertical direction, i.e., there is a compressive stress in the vertical direction in both the PM structure 126 and the BJT device 100, thereby leading to increased hole mobility through the base 110, which is beneficial for a PNP device.

In the cases above where the PM structure(s) 126 are positioned in the substrate 102 (see FIGS. 8-13), generating a horizontal tensile stress in the PM structure 126 (by virtue of the reverse piezoelectric effect) will also will generate an opposite type stress, e.g., a horizontal compressive stress, in a direction that is perpendicular to the direction of current flow 130 (vertically) within the NPN BJT device 100. That is, if the PM structure 126 elongates in the horizontal direction when subjected to the appropriate voltage, adjacent components of the NPN BJT device 100 will be compressed in the horizontal direction, i.e., there is a tensile stress in the horizontal direction in the PM structure 126 and a compressive stress in the horizontal direction of the base 110. Generating a horizontal compressive stress in the base 110 also results in a vertical tensile stress in the base 110 in the direction of current flow 130, thereby leading to increased electron mobility through the base 110, which is beneficial for an NPN device. Conversely, if the PM structure 126 contracts in the horizontal direction when subjected to the appropriate voltage, adjacent components of the BJT device 100 will elongate in the horizontal direction, i.e., there is a horizontal compressive stress in the PM structure 126 and a horizontal tensile stress in the base 110. Generating a horizontal tensile stress in the base 110 also results in a vertical compressive stress in the base 110 in the direction of current flow 130, thereby leading to increased hole mobility through the base 110, which is beneficial for an PNP device.

Figure 14:
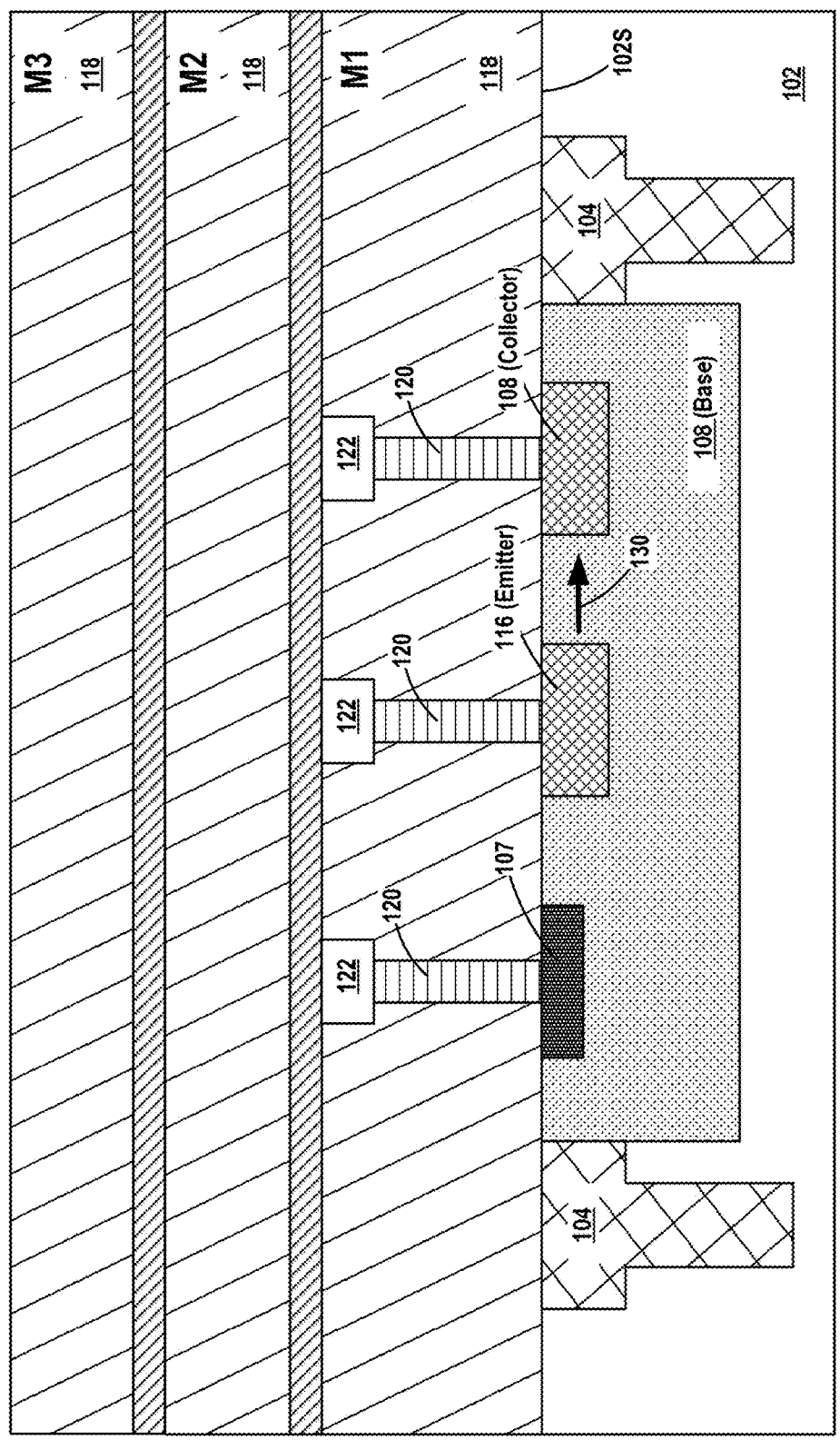

As noted above, the PM structures 126 and techniques disclosed herein may be employed with any type or form of bipolar transistor device where the electric mobility of the minority carriers in the base region (e.g., the electrons in an NPN device that pass through the base region) can be enhanced by the application of a mechanical stress (tensile or compressive). FIGS. 1-13 depicted a situation where the PM structures 126 were positioned adjacent an illustrative a vertical BJT device. FIG. 14 is a cross-sectional view of a situation where the PM structures 126 may be positioned adjacent a simplistically depicted lateral (or planar) NPN BJT device. In this illustrative example, the substrate 102 may doped N−, the base 110 may be a P-doped region positioned in the substrate 102 while the emitter 116 and the collector 108 may both be N+ doped regions that are positioned within the base 110. Also depicted in FIG. 14 is a doped (P+) contact region 107 positioned in the base 110. Each of the collector 108, the base 110 and the emitter 116 are contacted by a representative conductive contact 120 and a conductive line 122. In this lateral NPN BJT device, the direction of current flow 130 of the electrons from the emitter 116 through the base 110 through the collector 108 is substantially horizontal. Note that any of the various configurations of the PM structures 126 disclosed above in FIGS. 1-13 with the illustrative lateral NPN BJT device depicted in FIG. 14. For a lateral NPN BJT device, it is desirable to generate a tensile stress in the base 110 in the horizontal direction of current flow 130 through the base 110, as that will allow the electrons to pass through the P-doped base 110 more quickly. The desired tensile stress in the base 100 of the lateral NPN BJT device may be generated by applying a horizontally oriented tensile stress on the lateral NPN BJT device or by applying a vertical compressive stress on the lateral NPN BJT device. The opposite is true for a lateral PNP BJT device—it is desirable to generate a compressive stress in the horizontal direction of current flow 130 through the base 110, as that will allow the holes to pass through the N-doped base 110 more quickly. The desired compressive stress in the base 100 of the lateral PNP BJT device may be generated by applying a horizontally oriented compressive stress on the lateral PNP BJT device or by applying a vertical tensile stress on the lateral PNP BJT device.

As will be appreciated by those skilled in the art after a complete reading of the present application, the methods and structures disclosed herein that provide a means for enhancing the performance of a BJT device by generating a desired stress profile within the base via mechanical coupling of the BJT device with one or more of the voltage controlled PM structures 126 described above enables an additional feature not present with other stress-inducing methods. By adjusting the voltage applied to the PM structures 126, one can fine tune the performance of the BJT device in a certain range as desired. There is a relationship between the voltage applied to the PM structures 126 and the enhancement seen in the BJT device. This feature becomes valuable in applications where BJT mismatch needs to be reduced, as it allows customized adjustment for each particular device. Other advantages and features of the subject matter disclosed herein will be recognized by those skilled in the art after reading the present application.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is there-fore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A device, comprising:
   a semiconductor substrate;
   a bipolar junction transistor (BJT) device, the BJT device comprising a collector, a base and an emitter;
   at least one piezoelectric structure comprising a piezoelectric material positioned adjacent the BJT device; and
   at least first and second conductive contact structures that are conductively coupled to the piezoelectric structure.

2. The device of claim 1, wherein the at least one piezoelectric structure is positioned above an upper surface of the semiconductor substrate.

3. The device of claim 1, wherein an upper surface of the at least one piezoelectric structure is positioned substantially coplanar with an upper surface of the semiconductor substrate.

4. The device of claim 1, wherein at least a portion of the at least one piezoelectric structure is positioned within the semiconductor substrate.

5. The device of claim 1, wherein the at least one piezoelectric structure comprises a plurality of piezoelectric structures that are separated from one another.

6. The device of claim 1, wherein the at least one piezoelectric structure comprises a single continuous piezoelectric structure that, when viewed from above, has a ring-like structure with an opening therein, wherein the collector has an outer perimeter, the base has an outer perimeter and wherein the single continuous ring-like piezoelectric structure is positioned around at least the entire outer perimeter of one of the collector or the base.

7. The device of claim 5, wherein the plurality of piezoelectric structures comprises a first piezoelectric structure and a second piezoelectric structure that are positioned on opposite sides of the base.

8. The device of claim 1, wherein the at least one piezoelectric structure is adapted to deform when a voltage is applied to the at least one piezoelectric structure via the at least first and second conductive contact structures and thereby induce a stress in the BJT device.

9. The device of claim 1, wherein the at least one piezoelectric structure comprises a first piezoelectric structure that is at least partially positioned in the substrate at a location between a portion of the collector and the base.

10. The device of claim 9, wherein the at least one piezoelectric structure further comprises a second piezoelectric structure that is at least partially positioned in the substrate at a location outside of the collector, and wherein the base is positioned vertically above or in a space between the first and second piezoelectric structures.

11. The device of claim 1, wherein the at least one piezoelectric structure comprises a first piezoelectric structure and a second piezoelectric structure that are separated from one another, wherein each of the first and second piezoelectric structures is at least partially positioned in the substrate outside of the collector.

12. A device, comprising:
a semiconductor substrate;
a bipolar junction transistor (BJT) device, the BJT device comprising a collector, a base and an emitter;
at least one piezoelectric structure comprising a piezoelectric material positioned adjacent the BJT device, wherein the at least one piezoelectric structure is positioned above an upper surface of the semiconductor substrate; and
at least first and second conductive contact structures that are conductively coupled to the piezoelectric structure, wherein the at least one piezoelectric structure is adapted to deform when a voltage is applied to the at least one piezoelectric structure via the at least first and second conductive contact structures and thereby induce a stress in the BJT device.

13. The device of claim 12, wherein the at least one piezoelectric structure comprises a plurality of piezoelectric structures that are separated from one another.

14. The device of claim 12, wherein the at least one piezoelectric structure comprises a single continuous piezoelectric structure that, when viewed from above, has a ring-like structure with an opening therein, wherein the collector has an outer perimeter, the base has an outer perimeter and wherein the single continuous ring-like piezoelectric structure is positioned around at least the entire outer perimeter of one of the collector or the base.

15. The device of claim 13, wherein the BJT device is one of a vertical bipolar transistor device or a lateral bipolar transistor device and wherein the plurality of piezoelectric structures comprises a first piezoelectric structure and a second piezoelectric structure that are positioned on opposite sides of the base.

16. A device, comprising:
a semiconductor substrate;
a bipolar junction transistor (BJT) device, the BJT device comprising a collector, a base and an emitter;
at least one piezoelectric structure comprising a piezoelectric material positioned adjacent the BJT device, wherein the at least one piezoelectric structure is at least partially positioned in the semiconductor substrate; and
at least first and second conductive contact structures that are conductively coupled to the piezoelectric structure, wherein the at least one piezoelectric structure is adapted to deform when a voltage is applied to the at least one piezoelectric structure via the at least first and second conductive contact structures and thereby induce a stress in the BJT device.

17. The device of claim 16, wherein the at least one piezoelectric structure comprises a first piezoelectric structure that is positioned at a location between a portion of the collector and the base.

18. The device of claim 17, wherein the at least one piezoelectric structure further comprises a second piezoelectric structure that is at least partially positioned in the substrate at a location outside of the collector, and wherein the base is positioned vertically above a space between the first and second piezoelectric structures.

19. The device of claim 16, wherein the at least one piezoelectric structure comprises a first piezoelectric structure and a second piezoelectric structure that are separated from one another, wherein each of the first and second piezoelectric structures is at least partially positioned in the substrate outside of the collector.

20. The device of claim 16, wherein the at least one piezoelectric structure comprises a single continuous piezoelectric structure that, when viewed from above, has a ring-like structure with an opening therein, wherein the collector has an outer perimeter, the base has an outer perimeter and wherein the single continuous ring-like piezoelectric structure is positioned around at least the entire outer perimeter of one of the collector or the base.

* * * * *